United States Patent
Yamasaki

(10) Patent No.: US 6,663,740 B2
(45) Date of Patent: Dec. 16, 2003

(54) MANUFACTURING METHOD AND MANUFACTURING APPARATUS OF THIN-FILM LAMINATE

(75) Inventor: Akio Yamasaki, Suita (JP)

(73) Assignee: New Create Corporation, Osaka (JP)

( * ) Notice: Subject to any disclaimer, the term of this patent is extended or adjusted under 35 U.S.C. 154(b) by 198 days.

(21) Appl. No.: 09/901,003

(22) Filed: Jul. 10, 2001

(65) Prior Publication Data

US 2002/0162628 A1 Nov. 7, 2002

(30) Foreign Application Priority Data

May 7, 2001 (JP) .................................. 2001-135831

(51) Int. Cl.[7] .................. B32B 31/04; B32B 35/00
(52) U.S. Cl. ................ 156/248; 156/89.12; 156/249; 156/344; 156/510; 156/556; 156/570; 156/584
(58) Field of Search ................. 156/247, 248, 156/249, 89.12, 344, 510, 516, 517, 556, 570, 584

(56) References Cited

U.S. PATENT DOCUMENTS

| | | | |
|---|---|---|---|
| 4,185,814 A | * | 1/1980 | Buchmann et al. |
| 4,362,486 A | * | 12/1982 | Davis et al. |
| 5,573,620 A | * | 11/1996 | Sakai et al. ................ 156/249 |
| 5,676,789 A | * | 10/1997 | Hamamura ................ 156/344 |
| 5,725,347 A | * | 3/1998 | Hansen |
| 5,876,549 A | * | 3/1999 | Natarajan et al. ........... 156/249 |
| 6,109,323 A | * | 8/2000 | Baccini |
| 6,370,748 B1 | * | 4/2002 | Baccini |
| 2002/0029837 A1 | * | 3/2002 | Arishiro et al. |
| 2002/0053394 A1 | * | 5/2002 | Gisulfo ...................... 156/249 |

FOREIGN PATENT DOCUMENTS

JP 2001-35748 * 2/2001

OTHER PUBLICATIONS

"Mechanism for Peeling Paper from Greensheets," IBM Technical Disclosure Bulletin, Sep. 1980, vol. 23, issue 4, pp. 1328–1329.*

* cited by examiner

Primary Examiner—Curtis Mayes
(74) Attorney, Agent, or Firm—Rader Fishman & Grauer

(57) ABSTRACT

A manufacturing method of a thin-film laminate for manufacturing the thin-film laminate by sequentially laminating thin-film sheets having conductive patterns formed thereon, comprising the steps of housing thin-film sheets held by a carrier films adjusted to a prescribed size in a housing case; and in the middle of conveyance of the thin-film sheets in a state held by the carrier films and taken out from the housing case to a pressing and laminating position, stripping the thin-film sheets off the carrier films while conveying the same.

12 Claims, 14 Drawing Sheets

F I G. 6
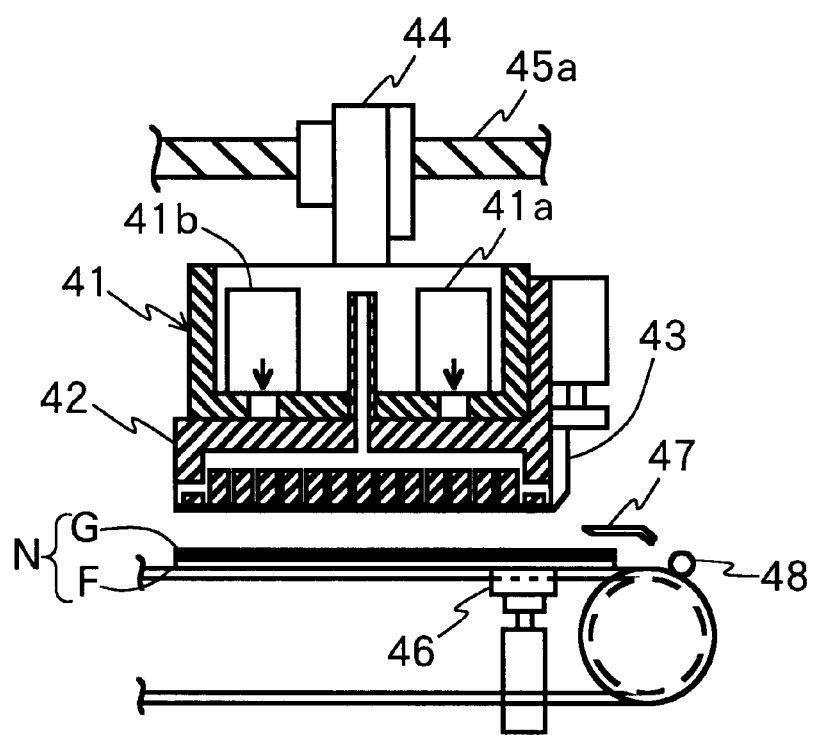

(a)

(b)

MANUFACTURING METHOD AND MANUFACTURING APPARATUS OF THIN-FILM LAMINATE

TECHNICAL FIELD OF THE INVENTION

The present invention relates to a manufacturing method and a manufacturing apparatus of a thin-film laminate. More particularly, the invention relates to a manufacturing method and a manufacturing apparatus of a thin-film laminate for manufacturing a thin-film laminate such as a multi-layer circuit board by laminating thin-film sheets made of a ceramic material having conductor patterns printed on the surface thereof.

BACKGROUND ART

As a manufacturing method of a thin-film laminate for manufacturing a thin-film laminate such as a substrate for LSI package, a multi-layer board or a laminated capacitor (chip capacitor), there is conventionally available a manufacturing method for manufacturing a thin-film laminate, comprising the steps of forming continuously green sheets (raw ceramic sheets) by a method known as the tape forming method on the surface of a flexible strip-shaped substrate called a carrier film piece, cutting the resultant green sheets into a prescribed size, forming a conductive pattern on each sheet by pattern printing or the like, and pressing and laminating the individual sheets, thereby manufacturing a thin-film laminate.

The aforementioned green sheet expands, contract or deforms shortly after peeling thereof from the carrier film piece, and should therefore preferably be integrated with the carrier film piece until immediately before lamination. Therefore, it is the conventional practice to cut the green sheets and the carrier film piece integrally into a prescribed size, and repeat the operating cycle of pressing the green sheets and separating the carrier films, thereby manufacturing a thin-film laminate.

More specifically, as shown in FIG. 17, a two-layer sheet piece N', having a prescribed size, prepared by integrally cutting a green sheet bearing a conductive pattern printed thereon (hereinafter referred to as a "conductive sheet") G' and a carrier film piece F' is placed on a green sheet (hereinafter referred to as a "dummy sheet") not bearing a conductive pattern printed thereon previously laminated on the laminating base 101 so that the conductive sheet G' comes into contact with the dummy sheet D', and the resultant laminate is pressed (refer to FIG. 17(a)). Then, lamination of a single conductive sheet G' is completed by peeling off the carrier film piece F' by sticking, for example, an adhesive tape (refer to FIG. 17(b)). A thin-film laminate is manufactured by laminating a prescribed number of conductive sheets G' in this manner. In this manufacturing method, positioning for lamination is carried out by fitting pin holes 102 and 102 formed in the two-layer sheet piece N' onto pins 103 and 103 provided at positions corresponding to the pin holes 102 and 102 on the laminating base 101.

The above-mentioned manufacturing method of a thin-film laminate as described above has the following problems:

(1) It takes much time to carry out the operation of peeling off the carrier film piece F' by means of an adhesive tape, and it is necessary to replace an adhesive having a reduced adhesion, resulting in a very low productivity.

(2) The conductive sheet G' is pressed under a considerable pressure to prevent the conductive sheet G' from peeling off together with the carrier film piece F' during stripping. The conductive sheets G' already laminated through repeated pressing is deformed.

(3) Positioning by means of the pin hole 102 and the pin 103 causes a shift of laminating position by an allowable difference between the pin hole 102 and the pin 103.

For the purpose of solving these problems in the conventional art, for example, a manufacturing apparatus of a thin-film laminate as shown in FIG. 18 is proposed in Japanese Laid Open Patent Publication No. 10-284346. This manufacturing apparatus J' is based on a process comprising the steps of setting a carrier film F', on the surface of which conductive sheets G' bearing conductive patterns printed at prescribed intervals are continuously formed in a delivery unit 101; paying off the carrier film F' from the delivery unit 101; sending the same by means of a rollers group 102 to a cutting base 103 by a prescribed length; cutting the conductive sheets G' to a prescribed size by means of a sheet cutting-carrying head 104 on the cutting base 103; holding by sucking each of the cut conductive sheets G' by means of the cutting-carrying head 104 and transferring the same to above a laminating base 105; and forming a laminate S' by pressing and laminating a prescribed number of conductive sheets G' on the laminating base 105.

In this manufacturing apparatus J', a laminating position is determined by picking up an image of positioning marks printed at prescribed intervals at positions corresponding to the conductive patterns on the conductive sheets G' by means of a CCD pickup apparatus 106, and correcting the amount of transfer of the sheet cutting-carrying head 104 on the basis of the image thus picked up. The aforementioned problems are substantially solved by this manufacturing apparatus J'. However, while this manufacturing apparatus J' is suitable for manufacturing a thin-film laminate bearing only a single kind of conductive pattern printed on the conductive sheets G' to be laminated, it involves a problem in that it is not suitable for manufacturing a thin-film laminate having 10 to 20 kinds of conductive patterns to be printed on the conductive sheets G' laminated as in a multi-layer substrate incorporated, for example, in a next-generation cellular phone. More specifically, in order to manufacture a thin-film laminate having even 10 to 20 kinds of conductive patterns in the manufacturing apparatus J', it is necessary to print 10 to 20 kinds of conductive patterns on the green sheets G' in the laminating sequence. The problem is that this leads to a very complicated printing operation.

The present invention was developed in view of these problems in the conventional art, and has an object to provide a manufacturing method and a manufacturing apparatus of the thin-film laminate, which do not require any complicated printing operation of conductive patters, and permit a high-accuracy lamination of conductive sheets, even when there are various kinds of the conductive patters to be printed on laminated green sheets.

SUMMARY OF THE INVENTION

The manufacturing method of a thin-film laminate of the present invention is a method for manufacturing the thin-film laminate by sequentially laminating thin-film sheets having conductive patterns formed thereon, comprising the steps of:

housing thin-film sheets held by carrier films adjusted to a prescribed size in housing cases; and, in the middle of conveyance of the thin-film sheets in a state held by the carrier films and taken out from the housing case to a pressing and laminating position, stripping the thin-film sheets off the carrier films while conveying the same.

The manufacturing method of a thin-film laminate of the invention further comprises the steps of causing a carrier to hold the thin-film sheets, and causing a stripping member to penetrate into the boundary between the thin-film sheets and the carrier films, thereby to strip the thin-film sheets from the carrier films.

Moreover, in the manufacturing method of a thin-film laminate of the invention, it is desirable that the length of the carrier film in the conveying direction is longer than the thin-film sheet, and the increment portion of the length is projected in the conveying direction, and the stripping member is caused to penetrate into the boundary between the thin-film sheet and the carrier film while moving the stripping member along the projecting portion.

Further, the manufacturing method of a thin-film laminate of the invention may comprise the steps of forming an unnecessary portion integrally with the thin-film sheet of the portion projecting in the conveying direction of the carrier film; then, positioning the thin-film sheet at a prescribed position; forming a separating groove at the boundary with the unnecessary portion; and causing the stripping member to penetrate into the boundary between the thin-film sheet and the carrier film while moving the stripping member along the bottom of the separating groove.

Further, in the manufacturing method of a thin-film laminate of the invention, the separating groove may be formed during the conveyance of the thin-film sheet to the laminating position.

Further, in the manufacturing method of a thin-film laminate of the invention, separating grooves may be formed and housed in the housing cases.

Further, in the manufacturing method of a thin-film laminate of the invention, furthermore, the carry-in side of the stripping member should preferably take a knife-edge shape.

Further, in the manufacturing method of a thin-film laminate of the invention, it is desirable that the carrier film from which the conductive sheet has been stripped off is guided by the stripping member to the discharge side.

On the other hand, the manufacturing apparatus of a thin-film laminate of the invention is a manufacturing apparatus of a thin-film laminate by sequentially laminating thin-film sheets having conductive patterns formed thereon, comprising a housing means which houses carrier films adjusted to a prescribed size holding thin-film sheets; a carry-out means which takes out the thin-film sheets housed in the housing means in a state held by the carrier films and transfers the same to a prescribed position; a conveying means which conveys the thin-film sheets taken out by the carry-out means in a state held by the carrier films to a prescribed position; a stripping means which strips off the thin-film sheets conveyed to the prescribed position by the conveying means from the carrier films while conveying the same; and a pressing-laminating means which presses and laminates the thin-film sheets.

The manufacturing apparatus of a thin-film laminate of the invention preferably further comprises a positioning means.

Moreover, the manufacturing apparatus of a thin-film laminate of the invention may further comprise a separating groove forming means.

Further, the manufacturing apparatus of a thin-film laminate of the invention may comprise the stripping means having a carrier which carries the thin-film sheets, and a stripping-guiding plate; wherein the thin-film sheets are stripped off from the carrier films by causing the carry-in side of the stripping-guiding plate to penetrate into the boundary between the thin-film sheets and the carrier films; and the carrier films are guided by the discharge side of the stripping-guiding plate to the discharge side.

Further, in the manufacturing apparatus of a thin-film laminate of the invention, the carry-in side of the stripping-guiding plate is preferably formed into a knife-edge shape.

Since the present invention provides the configuration as described above, the printing operation of conductive pattern does not become complicated even when manufacturing a thin-film laminate bearing many kinds of conductive patterns printed on the thin-film sheets to be pressed and laminated. Stripping of the thin-film sheets from the carrier films are accomplished in the middle of transfer to the pressing-laminating position. Pressing and lamination of the thin-film sheets can therefore be carried out efficiently.

BRIEF DESCRIPTION OF THE DRAWINGS

FIG. 6 is an operation descriptive view of the manufacturing apparatus shown in FIG. 1, illustrating the head as set at the cutting position.

FIG. 17(a) is a descriptive view of the pressing operation of the conductive sheet; and FIG. 17(b) shows the stripping operation of the carrier film.

DETAILED DESCRIPTION OF THE INVENTION

The present invention will now be described by means of embodiments with reference to the attached drawings. The invention is not limited to these embodiments.

Embodiment 1

Figure 1:
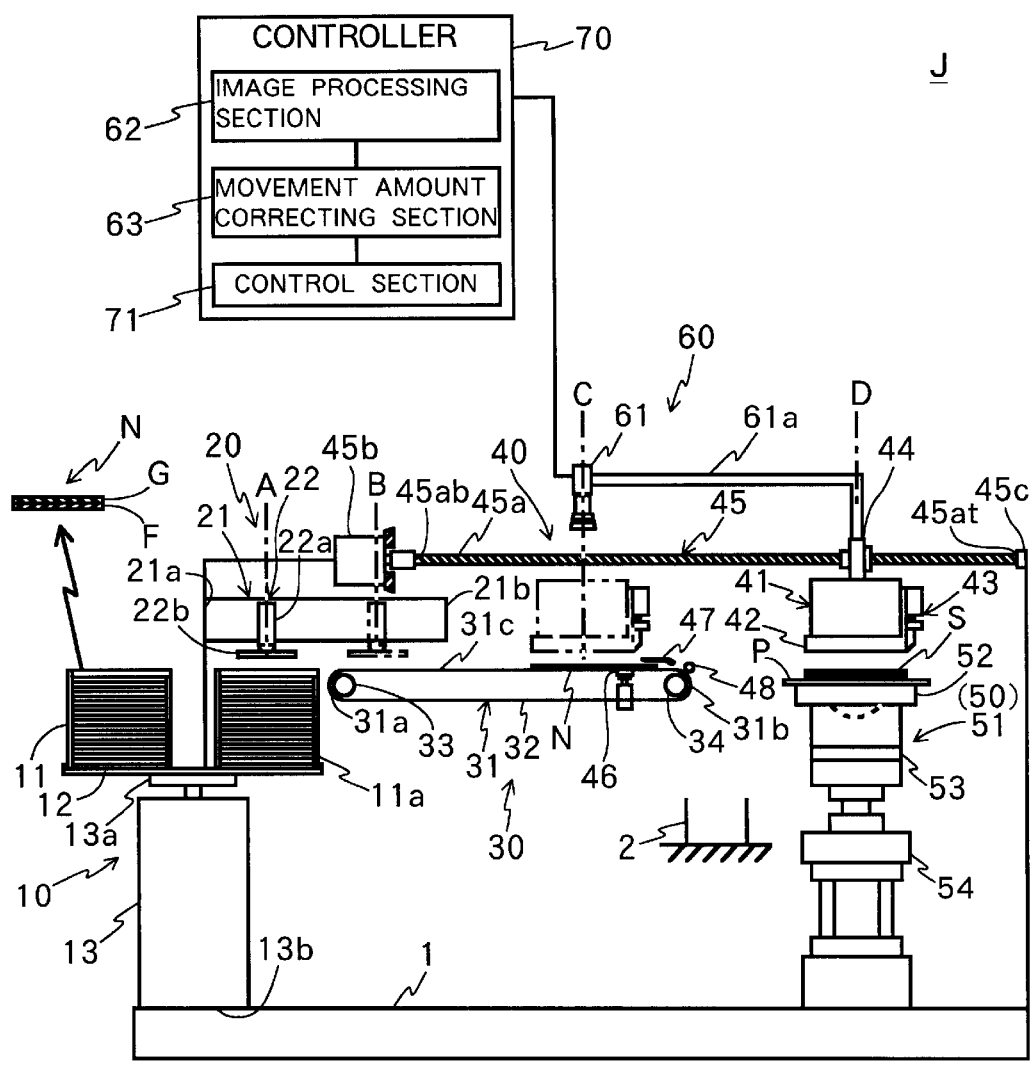
FIG. 1 is a schematic front view of the manufacturing apparatus of the thin-film laminate, to which the manufacturing method of the thin-film laminate of embodiment 1 of the invention is applied.
Figure 2:
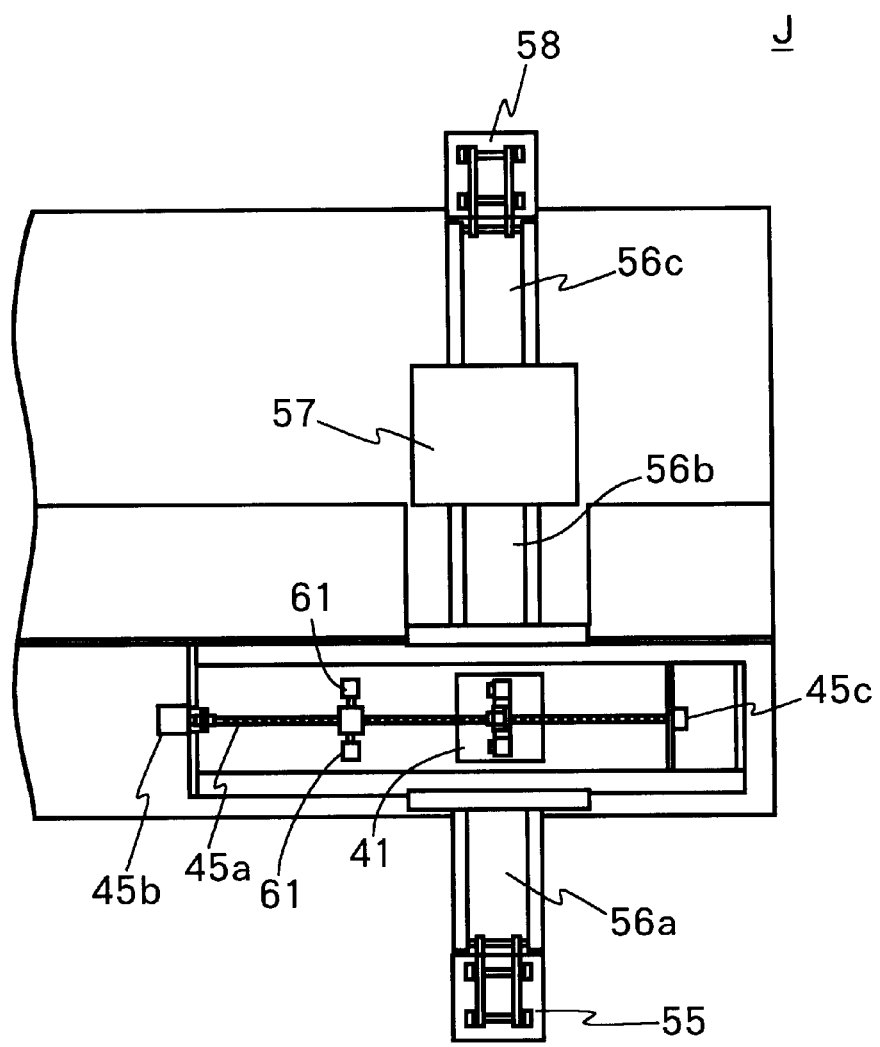
FIG. 2 is a partial schematic plan view of the manufacturing apparatus shown in FIG. 1.

Schematic configurations of the manufacturing apparatus of a thin-film laminate (hereinafter simply referred to as the "manufacturing apparatus") to which the manufacturing method of a thin-film laminate of embodiment 1 of the invention is applicable are illustrated in FIGS. 1 and 2. This manufacturing apparatus J is used for manufacturing a thin-film laminate (hereinafter simply referred to as a "laminate") S by pressing and laminating the green sheets (hereinafter referred to as "conductive sheets") having a prescribed size with a thickness of about 100 μm, and comprising a ceramic material bearing prescribed conductive patterns formed on the surface thereof. Particularly, it is suitably applicable to the manufacture of a multi-layer circuit board to be incorporated into the laminate S, which is required to press and laminate, in a prescribed sequence, a necessary number of the conductive sheets on which the diverse and various conductive patterns are formed respectively, for example, as in the case of application to the next-generation cellular phone.

More specifically, the manufacturing apparatus J comprises the main components including a housing section (housing means) 10, which houses two-layer sheet pieces N for every formed pattern, of a prescribed size, comprising conductive sheets G having prescribed conductive patterns on the surfaces thereof formed on the carrier films F of a prescribed size; a carry-out section (carry-out means) 20, which takes out the two-layer sheet pieces N housed in the housing section 10 at the takeout position A in a prescribed sequence, and transfers the same to the delivery position B; a transfer section (first transfer means) 30, which transfers the two-layer sheet piece N carried out by the carry-out section 20 to the cutting position C; a cutting-transfer section (cutting-transfer means) 40 which cuts the conductive sheet G in a prescribed size from the two-layer sheet piece N transferred by the transfer section 30 to the cutting position C, and transfers the same to the pressing-laminating position D; a pressing-laminating section (pressing-laminating means) 50, which presses and laminates the conductive sheet G cut by the cutting-transfer section 40 into a prescribed size and transferred to the pressing-laminating position D; a positioning section (positioning means) 60, which positions the cutting position C, and the pressing-laminating position D; and a controller 70, which controls these components 10, 20, 30, 40, 50, and 60.

Here, the two-layer sheet pieces N is prepared by continuously forming a strip-shaped green sheet on the surface of a strip-shaped carrier film made of a hard synthetic resin material having an appropriate elasticity such as a biaxial drawn polyethylene terephthalate film (polyester film) or a biaxial drawn polypropylene film, printing prescribed conductive patterns at prescribed intervals on the strip-shaped green sheet, and cutting the resulting two-layer sheet to a prescribed size in correspondence to the conductive patterns. More specifically, the two-layer sheet piece N is cut so that the size thereof in a direction perpendicular to the transfer direction (hereinafter referred to as the "width direction") is equal to the width-direction size of the laminate S, and that the transfer-direction size thereof is larger than that of the laminate S by a prescribed amount with a view to facilitating peeling of the conductive sheet G described later. With a view to further facilitating peeling of the conductive sheet G, it is recommendable to coat a stripping agent onto the surface of the carrier film F on which the green sheet is to be formed.

The conductive sheet G is prepared by coating a slurry comprising various kinds of ceramic dielectric powder, a resin binder or a plasticizer, a surfactant (dispersant) and an organic solvent onto the surface of the carrier film F into a small thickness by the doctor blade process or the like, drying the same, printing a conductive pattern comprising a conductive material containing powder of a metal such as palladium, silver or nickel on the surface of the resultant green sheet by, for example, the screen printing process, and printing positioning marks (not shown in a figure) serving as targets of positioning by the positioning section 60.

The housing section 10 comprises a necessary number of housing cases 11, 11, . . . which house the two-layer sheet pieces N; a disk-shaped turntable 12 onto which the housing cases 11, 11, . . . are radially placed and secured; and a servo motor 13 of which the driven end 13a is connected to the back of the turntable 12 with the rotation center thereof aligned with the rotation center of the turntable 12 and the trailing end 13b is fixed to the base 1. The number of housing cases 11 is equal to the number of kinds of conductive patterns necessary for the laminate S to be manufactured, and the housing cases 11 are placed and fixed radially on the turntable 12 at the prescribed intervals.

The carry-out section 20 has a horizontal drive mechanism 21, and a carry-out jig 22 horizontally driven by the horizontal drive mechanism 21. The base end 21a of the horizontal drive mechanism 21 is fixed to a prescribed position above the turntable 12, and the leading end thereof extends horizontally to a prescribed position above the transfer section 30. This horizontal drive mechanism 21, although not clearly shown in the figure, is a ball screw drive mechanism, and the carry-out jig 22 is attached to a ball screw thereof. The carry-out jig 22 comprises a carry-out jig main body 22a such as an air cylinder attached to the horizontal drive mechanism 21, and the sucker 22b detachably sucks and holds the two-layer sheet piece N vertically moved by a drive member such as a piston rod. This sucker 22b is a publicly known one which attaches and detaches the two-layer sheet piece N by adjusting the negative pressure of a sucking section. The carry-out jig 22 reciprocates from the take-out position A, where it takes out the two-layer sheet piece N from the housing case 11a located at the take-out position A, to the delivery position B for the transfer section 30.

The transfer section 30 comprises a belt conveyor 31 arranged horizontally, and the one end (carry-in end) 31a is adjacent to the housing case 11a located at the take-out position A, and the other end (carry-out end) 31b is in the proximity of the pressing-laminating section 50. The transfer surface 31c thereof is substantially flush with the upper end of the housing case 11a. Although not clearly shown in the figure, the conveyor belt 32 has a configuration in which several narrow-width belts are stretched between the rollers 33 and 34 (refer to FIG. 4).

The cutting-transfer section 40 comprises a cutting mechanism (cutting means) which cuts an unnecessary portion Ga of the conductive sheet G of the two-layer sheet piece N transferred by the transfer section 30 to the cutting position C; a stripping mechanism which strips off the conductive sheet G from the carrier film F; and a transfer mechanism (second transfer means) which transfers the conductive sheet G stripped from the carrier film F to the pressing-laminating section 50.

Figure 3:
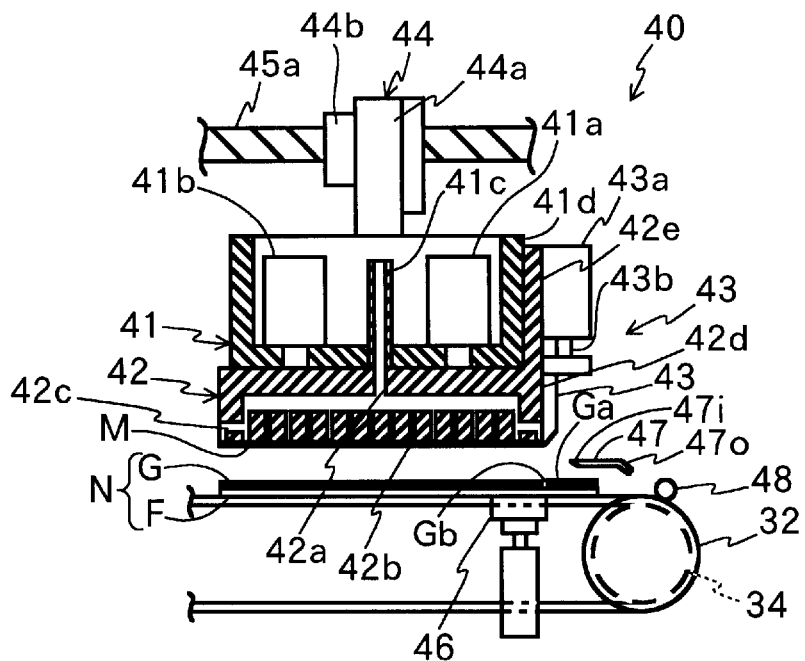
FIG. 3 is partially enlarged view of the manufacturing apparatus shown in FIG. 1.

More specifically, as shown in FIG. 3, the cutting-transfer section 40 comprises a head (transfer means) 41 having a box-shaped sucker 42 that can freely be lifted or lowered and a cutting blade 43 that can freely be lifted or lowered; a holding member 44 which holds the head 41; a transfer mechanism 45 which transfers the holding member 44; a horizontal member 46 that can freely be lifted or lowered; a stripping-guiding plate 47 which strips off the conductive sheet G from the carrier film F and guides the carrier film F to the discharge side; and the discharge roller 48 which causes the carrier film F, from which the conductive sheet G has been stripped off, to drop into the dust box 2. And, the cutting mechanism (cutting means) is composed of the box-shaped sucker 42, the cutting blade 43, and the horizontal member 46. The stripping mechanism (stripping means) is composed of the box-shaped sucker 42, the transfer mechanism 45, the horizontal member 46, and the stripping-guiding plate 47. Note that in FIG. 3, the reference numeral Ga represents an unnecessary portion of the conductive sheet G, and the reference numeral Gb represents a separating groove.

The head 41 is a box of which upper surface is open. The front lifting cylinder (air cylinder) 41a and the rear lifting cylinder (air cylinder) 41b are longitudinally arranged on the bottom surface of the head 41, and the exhaust pipe 41c is arranged at the center thereof. Each rod of the front lifting cylinder 41a and the rear lifting cylinder 41b passes through the bottom of the head 41, and are connected to the upper surface of the box-shaped sucker 42 arranged below the head 41. And, the leading end (lower end) of the exhaust pipe 41a passes through the bottom of the head 41, and is connected to the exhaust hole 42a formed in the upper surface of the box-shaped sucker 42. Although not shown in a figure, a flexible piping from an exhaust apparatus (not shown in a figure) is connected to the upper end of the exhaust 41c.

The box-shaped sucker 42 is hollow, and each rod of the front lifting cylinder 41a and the rear lifting cylinder 41b longitudinally arranged on the bottom surface of the box-shaped head 41 are connected to the upper surface thereof after passing through the bottom of the head 41, as described above. This makes it possible for the box-shaped sucker 42 to move up and down. The leading end of the exhaust pipe 41c is connected to the exhaust pipe 42a formed at the center of the upper surface after passing through the bottom of the head 41. The mesh plate M is stuck to the lower surface (sucking surface) of the box-shaped sucker 42, and although not clearly shown in the figure, a large number of the holes 42b for sucking the conductive sheet G are formed through the plate. On the other hand, although not clearly shown in the figure, the pressure adjusting holes 42c for adjusting the negative pressure in the box-shaped sucker 42, when the conductive sheet G is sucked onto the sucking surface, to be an appropriate value are provided at appropriate intervals at the side thereof.

The front end of the box-shaped sucker 42 extends upward along the front surface 41d of the box-shaped head 41 in parallel with the front surface 42d to form the guiding section 42e to guide the lifting and lowering movement of the box-shaped sucker 42. The flat side surface of the cutting blade 43 is brought into contact with the guiding section 42e, and is attached in such a manner that it can be slid up and down freely while the blade does not project at the initial position. More specifically, the air cylinder 43a is fixed to the upper portion of the guiding section 42e, and the leading end of the rod 43b thereof is connected to the back of the cutting blade 43. With this, the cutting blade 43 is attached to the guiding section 42e so as to be slid up and down freely.

The holding section 44a of the holding member 44 is connected to an appropriate position of the head 41, and the base 44b thereof is engaged with the drive shaft 45a of the transfer mechanism 45. Moreover, the holding member 44, although not shown in a figure, is driven while being guided by a guiding mechanism such as an LM guide.

The transfer mechanism 45 comprises a horizontal drive shaft 45a which mounts the holding member 44 so as to permit driving, and a servo motor 45b which drives the horizontal drive shaft 45a. The drive shaft 45a has a length long enough to permit the transfer of the head 41 from the cutting position C to the pressing-laminating position D. In this embodiment 1, as shown in FIG. 1, the base end 45ab of the horizontal drive shaft 45a is located at an appropriate position above the belt conveyor 31, and on the other hand, the leading end 45at thereof is supported by the bearing 45c at an appropriate position beyond the pressing-laminating section 50 so that it can be rotated. As the driving system, it is preferable to employ a driving system by means of the ball screw because of a high positioning accuracy. That is, it is desirable to adopt a configuration in which the horizontal drive shaft 45a is a ball screw shaft, and the ball screw nut provided on the holding member 44 is attached to this ball screw shaft.

Figure 4:
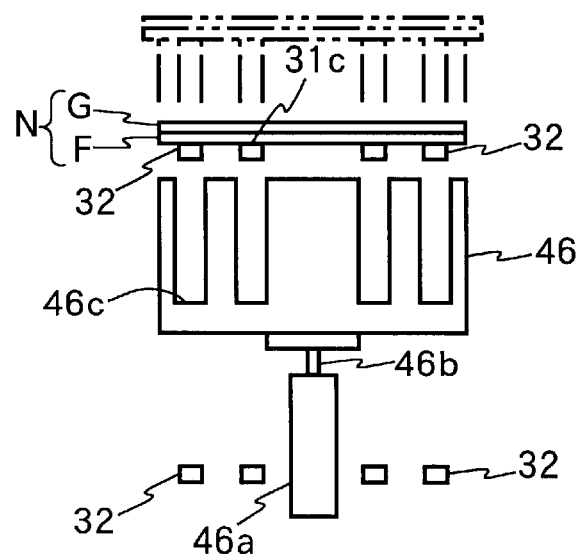
FIG. 4 is an enlarged view of the horizontal member of the manufacturing apparatus shown in FIG. 1.

The horizontal member 46 is arranged so that the leading end thereof is positioned below the cutting blade 43 when the head 41 is set at the cutting position C, and the upper surface thereof is at a prescribed position below the upper surface 31c of the belt conveyor 31 so as not to cause any trouble in the transfer of the two-layer sheet piece N on the belt conveyor 31 (refer to FIG. 4). The leading end of the rod 46b of the air cylinder 46a arranged below the horizontal member 46 is connected to the center of the lower surface thereof to permit free lifting and lowering movement of the horizontal member 46. As shown in FIG. 4, the grooves 46c having a width corresponding to the narrow-width belt 32 (four grooves in the example shown in FIG. 4) of the belt conveyor 31 are formed on the horizontal member 46. The depth of the grooves 46c is adjusted so as to maintain a projecting height not causing any trouble in the stripping operation of the conductive sheet G from the carrier film piece F.

As shown in FIG. 3, the stripping-guiding plate 47 is arranged at a prescribed height position of the upper surface 31c of the belt conveyor 31 at a prescribed distance in the front of the cutting blade 43. More specifically, the position and the height are adjusted so as to permit stripping of the conductive sheet G sucked and held by the box-shaped sucker 42 from the carrier film F in cooperation with the horizontal member 46. That is, when the head 41 is set by the transfer mechanism 45 at the cutting position C, the position and the height of the stripping-guiding plate 47 are adjusted so as to be positioned above the unnecessary portion Ga in front of the cutting blade 43 at a prescribed distance.

Moreover, in the stripping-guiding plate 47, as shown in FIG. 3, a lower corner of the end face on the carry-in side 47i is beveled so as to form a knife-edge-shaped stripping section to permit stripping of the conductive sheet G from the carrier film F, and on the other hand, an end on the discharge side 47o is folded downward to form a guiding section to guide the carrier film F to the discharge roller 48.

The discharge roller 48 brings the carrier film F guided by the stripping-guiding plate 47 into contact with the roller 34 via the belt 32.

The pressing-laminating section 50, more specifically, serves as a pressing-laminating mechanism 51. This pressing-laminating mechanism 51 comprises a press table 52, on which the conductive sheets G cut to a prescribed size are pressed and laminated into the laminate S; a table position correcting mechanism 53 which adjusts the vertical and horizontal positions of the press table 52; and a hydraulic cylinder 54 which moves the press table up and down. And, the pressing-laminating mechanism 51 lifts up the press table 52 upward by means of the hydraulic cylinder 54 to press and laminate the conductive sheets G sucked and held by the head 41 into the laminate S.

Moreover, as shown in FIG. 2, the laminate S is formed on a carrier plate P being fed from a carrier plate feeder 55, transferred and placed on the press table 52 by the conveyor 56a. The carrier plate P is coated with a low-viscosity or thermo-peeling paste on the upper surface. As a result, the laminate S is affixed to the surface, and when removing the laminate S from the carrier plate P, it is possible to strip it off without the risk of damaging the conductive sheet G. Not coating the paste directly on the upper surface of the carrier plate P, but instead a two-side adhesive sheet coated with a low-viscosity or thermo-peeling tape may be affixed to the carrier plate P to press and the conductive sheets G thereon.

The carrier plate P on which the laminate S has been formed on the press table 52 is transferred by the conveyor 56b to the main press 57, and after the main pressing is applied as required, it is transferred by the conveyor 56c to the carrier plate housing apparatus 58 and then housed.

The positioning section 60 comprises CCD image pickup units 61 and 61, which pick up an image of the positioning mark printed on the conductive sheet G; an image processing section 62, which applies a prescribed image processing such as highlighting or noise removal to the image data picked up by the CCD image pickup units 61 and 61; and a movement amount correcting section 63, which calculates the amount of the movement by correcting the amount of the movement upon moving the head 41 by means of the transfer mechanism 45 to the cutting position C on the basis of the image data thus processed by the image processing section 62, and calculates the amount of the movement by correcting the deviation from a reference position upon moving the head 41 from the cutting position C to the pressing-laminating position D. The image processing section 62 and the movement amount correcting section 63 are more specifically composed of the controller 70.

The CCD image pickup units 61 and 61 are supported directly by the supporting member 61a on the head, and this makes it possible to solve a positioning error caused by heat expansion of the ball screw shaft 45a, and accurately press and laminate the conductive sheets G. The supporting positions of the CCD image pickup units 61 and 61 by the supporting member 61a are adjusted so as to permit image pickup of the cutting position C upon positioning the head 41 at the pressing-laminating position D.

The controller 70 comprises a CPU, a ROM storing various programs for controlling the manufacturing apparatus J, and a storage unit comprising a RAM for recording various data arithmetically operated by the CPU. It comprises a control section 71, which controls the housing section 10, the carry-out section 20, the transfer section 30, the cutting-transfer section 40, the pressing-laminating section 50, and the positioning section 60, and also comprises the image processing section 62 and the movement amount correcting section 63. The control section 71 adjusts, for example, the amount of the movement upon moving the head 41 in response to an output signal of the movement amount correcting section 63, and carries out the following control operations.

Next, the lamination of the conductive sheets G by the manufacturing apparatus J having the configuration as described above will now be described with reference to FIGS. 5 to 11. Note that the lamination is accomplished under control by the controller 70.

Figure 5:
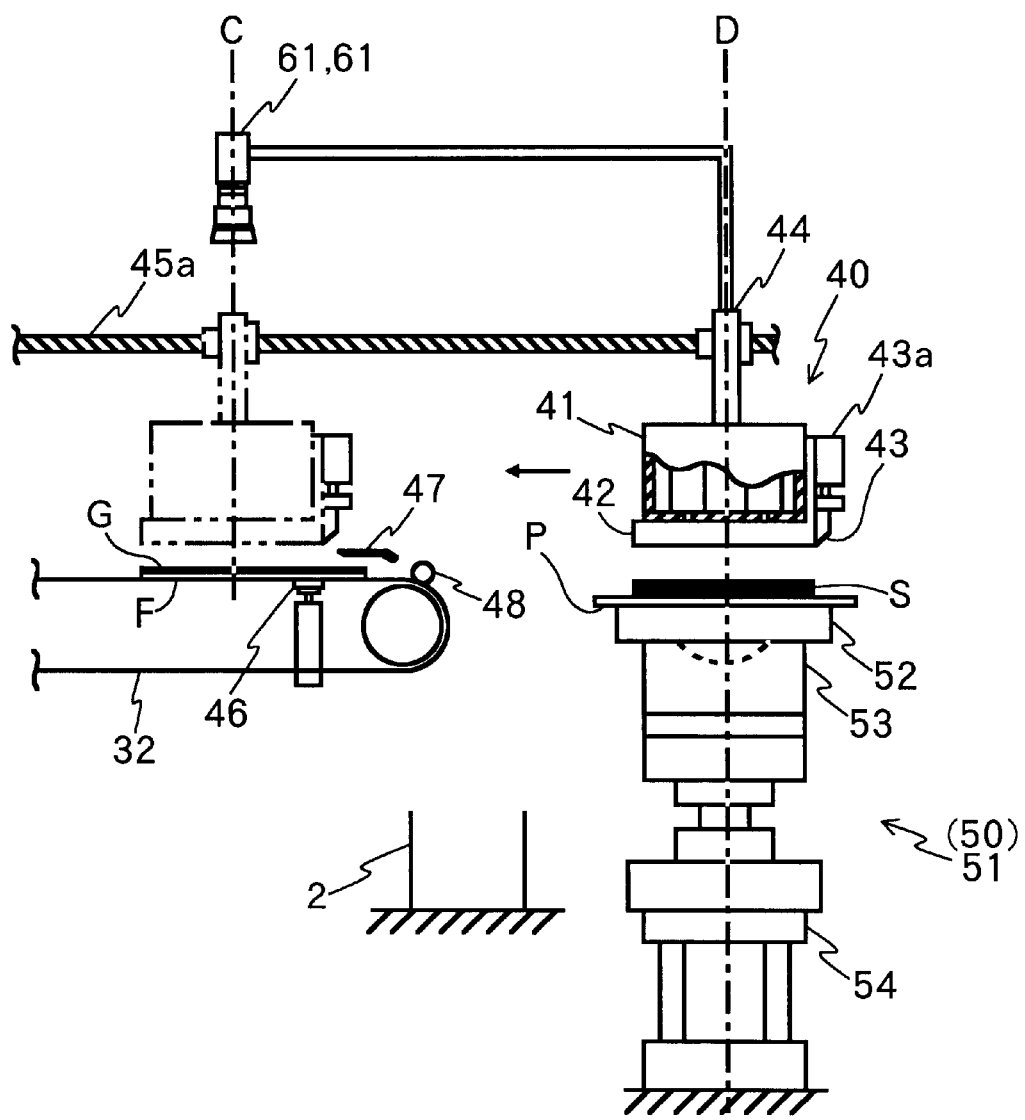
FIG. 5 is an operation descriptive view of the manufacturing apparatus shown in FIG. 1, illustrating the pickup of an image of a two-layer sheet set at the cutting position.
Figure 7:
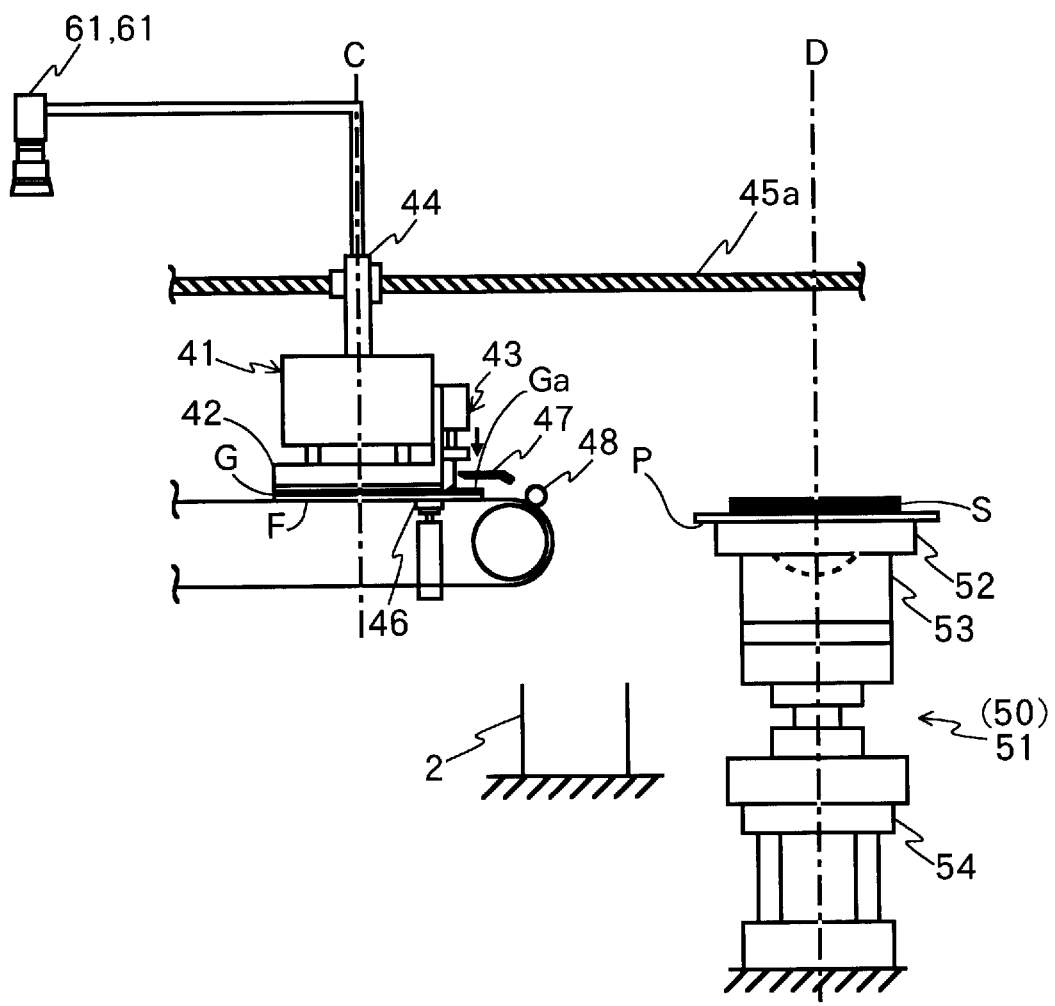
FIG. 7 is an operation descriptive view of the manufacturing apparatus shown in FIG. 1, illustrating the unnecessary portion of the conductive sheet cut by the cutting blade.
Figure 8:
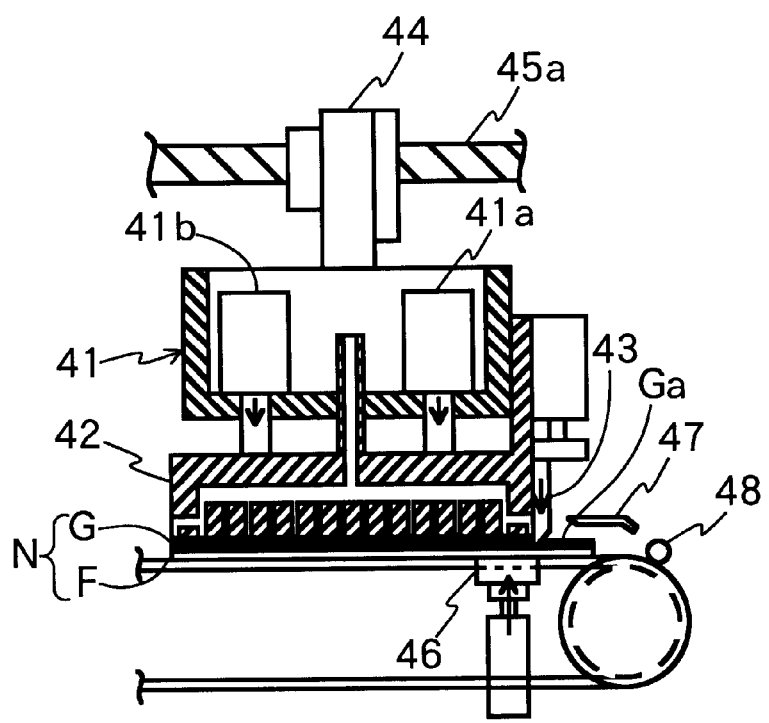
FIG. 8 is a partially enlarged view of FIG. 7.
Figure 9:
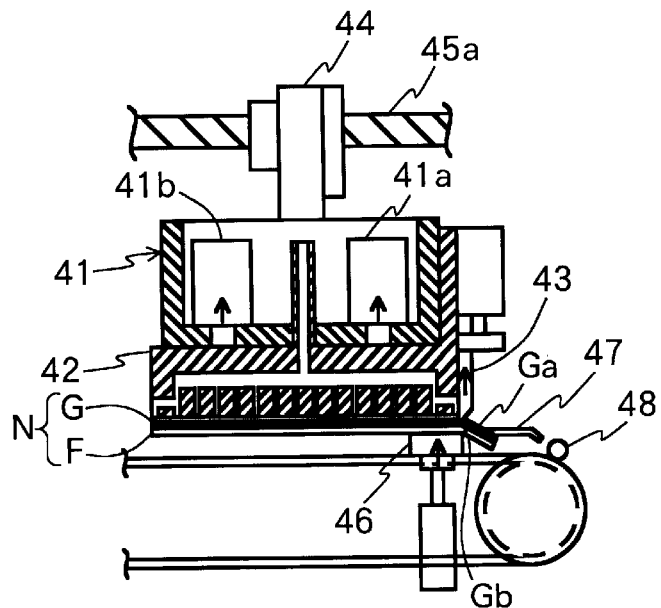
FIG. 9 is an operation descriptive view of the manufacturing apparatus shown in FIG. 1, illustrating the box-shaped sucker returned to the initial position.
Figure 10:
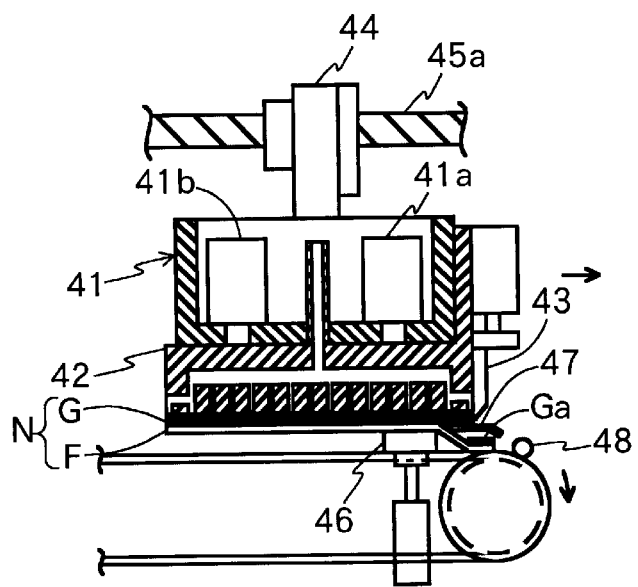
FIG. 10 is an operation descriptive view of the manufacturing apparatus shown in FIG. 1, illustrating the conductive sheet stripped off by the stripping-guiding plate.
Figure 11:
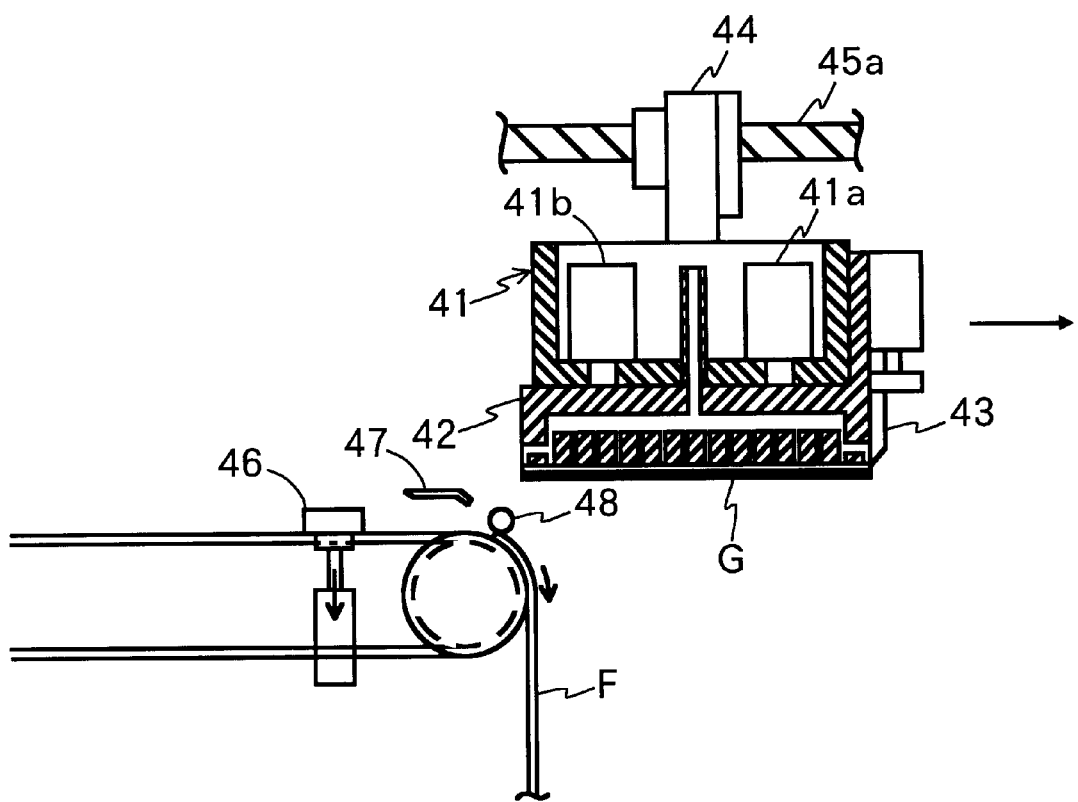
FIG. 11 is an operation descriptive view of the manufacturing apparatus shown in FIG. 1, illustrating the completion of stripping of the conductive sheet by the stripping-guiding plate.

(1) By causing the turntable 12 to rotate by a prescribed amount, the housing case 11a housing the two-layer sheet piece N bearing the prescribed conductive patterns is set at the take-out position A;

(2) By positioning the carry-out member 22 at the take-out position A and by lowering the sucker 22b, the two-layer sheet piece N in the housing case 11a is sucked and held by the sucker 22b;

(3) After restoring the sucker 22ba sucking and holding the two-layer sheet pieces N to the initial height, the carry-out member 22 is moved to the delivery position B by the horizontal drive mechanism 21;

(4) After placing the two-layer sheet piece N onto the belt conveyor 31 by causing the sucker 22b to descend, sucking by the sucker 22b is released;

(5) After moving the sucker 22b back to the initial position, the two-layer sheet piece N is transferred to the cutting position C by driving the belt conveyor 31;

(6) By positioning the head 41 at the pressing-laminating position D, and by setting the CCD image pickup units 61 and 61 at the cutting position C, the image of positioning marks of the conductive sheet G is picked up by the same image pickup units 61 and 61 (refer to FIG. 5);

(7) After causing the prescribed image processing to the image picked up by the CCD image pickup units 61 and 61 in the image processing section 62, the amount of the movement upon moving the head 41 from the pressing-laminating position D to the cutting position C, as well as the amount of the movement upon moving the same head from the cutting position C to the pressing-laminating position D are calculated by the movement amount correcting section 63, on the basis of the image-processed image data. This calculation is accomplished by correcting a previously set amount of the movement in response, for example, to the amount of deviation from the reference position of the picked up positioning marks;

(8) By driving the transfer mechanism 45 and by moving the holding member 44 in accordance with the calculated amount of the movement, the head 41 is positioned at the cutting position C (refer to FIG. 6);

(9) After driving the front and rear lifting cylinders 41a and 41b, and after lowering the box-shaped sucker 42 to bring the sucking surface into contact with the conductive sheet G, the conductive sheet G is sucked and held onto the sucking surface by achieving a prescribed negative pressure in the interior of the box-shaped sucker 42;

(10) The unnecessary portion Ga of the conductive sheet G is separated from the conductive sheet G by lowering the cutting blade 43 (refer to FIGS. 7 and 8); in this case, the lowering pressure of the cutting blade 43 is adjusted so that the carrier film F is not cut upon cutting the unnecessary portion Ga;

(11) Returning to the initial position is made by lifting the cutting blade 43;

(12) Returning to the initial position is made by driving the front and rear lifting cylinders 41a and 41b and by lifting the box-shaped sucker 42, and the horizontal member 46 is lifted by a prescribed amount (refer to FIG. 9). This prescribed amount is adjusted so that the gap formed between the two-layer sheet piece N sucked and held onto the sucking surface is within a range of 10 μm to 100 μm. This is to ensure smooth stripping of the carrier film F by the cooperation of the horizontal member 46 and the stripping-guiding plate 47 when moving the head 41 toward the pressing-laminating position D;

(13) Driving again the transfer mechanism 45 to start movement of the holding member 44 in accordance with the amount of movement calculated in step (7); that is, starting horizontal movement of the head 41 toward the pressing-laminating position D; driving again the belt conveyor 31 simultaneously with the horizontal movement of the head 41;

(14) Since the portion of the carrier film F on which the leading end of the unnecessary portion Ga is placed is in contact with the knife-edge-shaped surface on the carry-in side 47i of the stripping-guiding plate via the unnecessary portion Ga as shown in FIG. 9, the portion of the carrier film F on which the unnecessary portion Ga is placed creeps into the space below the stripping-guiding plate 47 while keeping the unnecessary portion Ga placed on it. In this case, since the carrier film F has an appropriate elasticity, the unnecessary portion Ga creeps into the space below the stripping-guiding plate 47 while a force is being applied onto the knife-edge-shaped surface by the restoring force of the carrier film F;

(15) Horizontal movement of the head 41 directed toward the pressing-laminating position D is continued, and the separating groove Gb is reaches the leading end of the knife-edge-shaped surface. As described above, since the carrier film F tends to return to the original shape of a flat sheet under the effect of its restoring force, when the separating groove Gb reaches the leading end of the knife-edge-shaped surface, the carrier film F, i.e., the bottom of the separating groove Gb reaches the leading end of the knife-edge-shaped surface;

(16) Horizontal movement of the head 41 directed toward the pressing-laminating position D is continued, and the carry-in side 47i of the stripping-guiding plate 47 enters into the boundary between the carrier film F and the conductive sheet G, while the knife-edge-shaped surface is in contact with the carrier film F, i.e., the bottom of the separating groove Gb (refer to FIG. 10). This results in partial stripping of the conductive sheet G from the carrier film f;

(17) Horizontal movement of the head 41 directed toward the pressing-laminating position D is continued, and the leading end of the carrier film F is entrapped by the discharge roller 48, being guided by the discharge side 47o of the stripping-guiding plate 47;

(18) Horizontal movement of the head 41 directed toward the pressing-laminating position D is continued, and the trailing end of the conductive sheet G is stripped off from the trailing end of the carrier film F (refer to FIG. 11). That is to say, stripping of the conductive sheet G from the carrier film F is now completed. In accordance with this, the horizontal member 46 is returned to the initial position;

(19) The conductive sheet G stripped off from the carrier film F is sucked and held by the head 41, and transferred to the pressing-laminating position D. On the other hand, the carrier film F from which the conductive sheet G has been stripped off is conveyed by the discharge roller 48, and recovered into the dust box 2;

(20) When the head 41 sucking and holding the conductive sheet G is positioned at the pressing-laminating position D, the press table 52 shall be lifted and brought into contact with the conductive sheet G by driving the pressing-laminating mechanism 51;

(21) By releasing sucking and holding of the conductive sheet G by the box-shaped sucker 42, the conductive sheet G is placed on the press table 52;

(22) By driving the pressing-laminating mechanism 51, the press table 52 is lowered, and returned to the initial position thereof; and

(23) Repeating the steps (1) to (22) for a prescribed number of times, the lamination of the laminate S onto which the necessary number of conductive sheets G have been laminated is now completed. Note that in the step (20), by driving the table position correcting mechanism 53 according to necessity, a positional adjustment of the press table 52 is made.

According to the embodiment 1, as described above, the conductive sheet G is stripped off from the two-layer sheet piece previously cut to a prescribed size and pressed and laminated. Therefore, even when manufacturing the laminate S bearing various kinds of conductive patterns printed on the conductive sheets G to be laminated, it is not necessary to print the conductive patterns in the laminating sequence. The printing operation of the conductive patterns is thus remarkably simplified.

Moreover, because the CCD image pickup units 61 and 61 of the positioning section 60 are supported by the head 41 to ensure integrated movement with the head 41, a positional error caused by thermal expansion of the ball screw shaft 45a is eliminated, and the conductive sheets G can be accurately cut and laminated.

Embodiment 2

Figure 12:
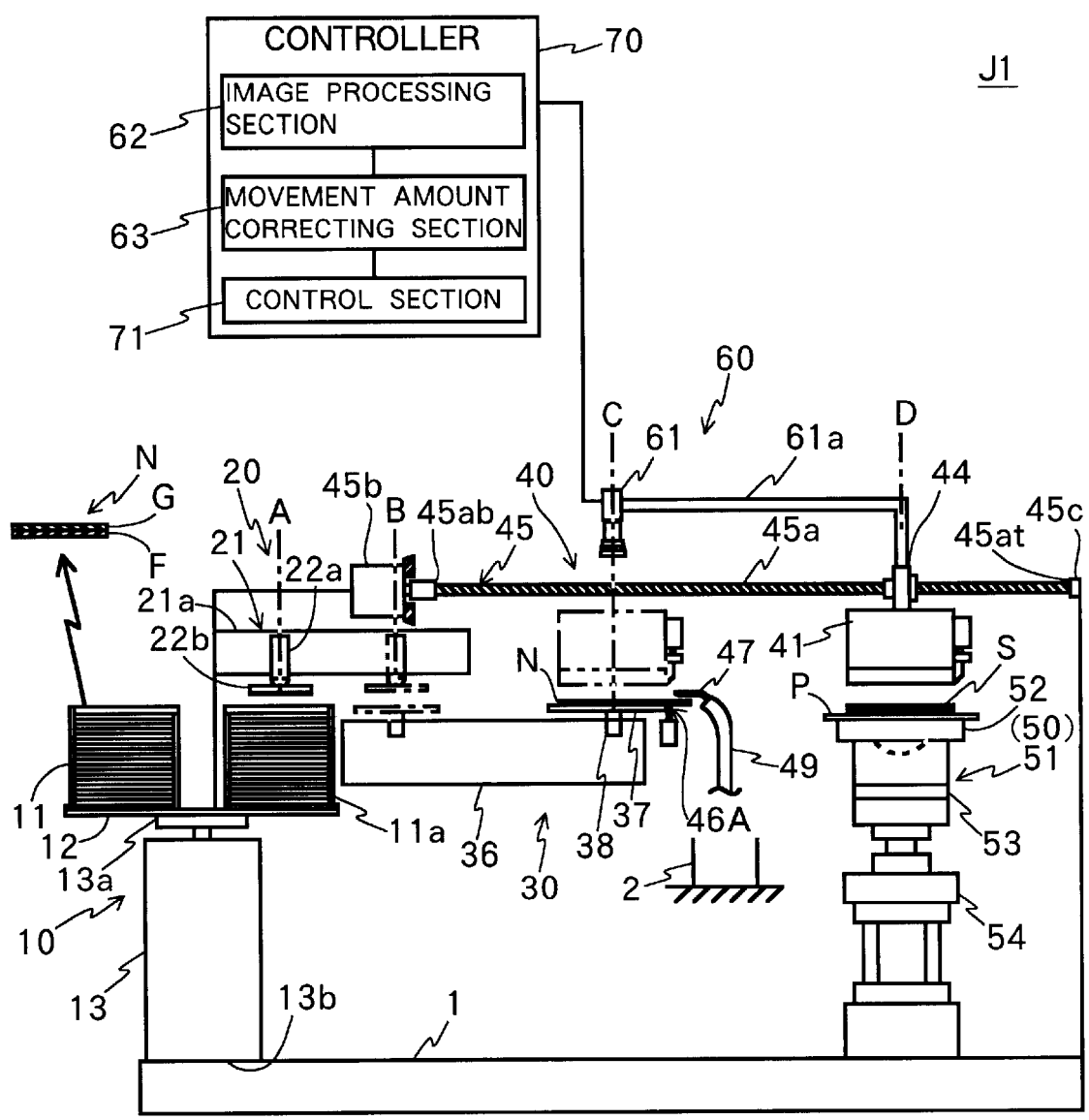
FIG. 12 is a schematic front view of the manufacturing apparatus of the thin-film laminate, to which the manufacturing method of the thin-film laminate of embodiment 2 of the invention is applied.

A schematic configuration of the manufacturing apparatus J1 to which the manufacturing method of the laminate S of embodiment 2 of the present invention is applied is illustrated in FIG. 12. The manufacturing apparatus J1 is the manufacturing apparatus J of embodiment 1 in which the transfer section (transfer means) 30 and the cutting-transfer section (cutting-transfer means) 40 are modified.

Note that the other components of the manufacturing apparatus J1 of embodiment 2 are the same as in the manufacturing apparatus J of embodiment 1.

The following description is mainly based on the differences between embodiments 2 and 1.

The transfer section 30 comprises a horizontal drive mechanism 36, and a moving table 37 horizontally driven by the horizontal drive mechanism 36. In the horizontal drive mechanism 36, the moving table 37 reciprocates between the delivery position B and the cutting position C. The horizontal drive mechanism 36 is, for example, a ball screw drive mechanism, in which the base of an air cylinder 38 for lifting the moving table 37 is attached to a ball screw nut. The surface of the moving table 37 serves as the sucking surface. That is to say, the ceiling plate of the moving table 37 is a box-shaped sucker.

The cutting-transfer section 40 comprises a cutting mechanism (cutting means) which cuts the unnecessary portion Ga of the conductive sheet G of the two-layer sheet piece N transferred by the transfer section 30 to the cutting position C; a stripping mechanism (stripping means), which strips off the conductive sheet G from the carrier film F; and a transfer mechanism (second transfer means), which transfers the conductive sheet G stripped off from the carrier film F to the pressing-laminating section 50.

Figure 13:
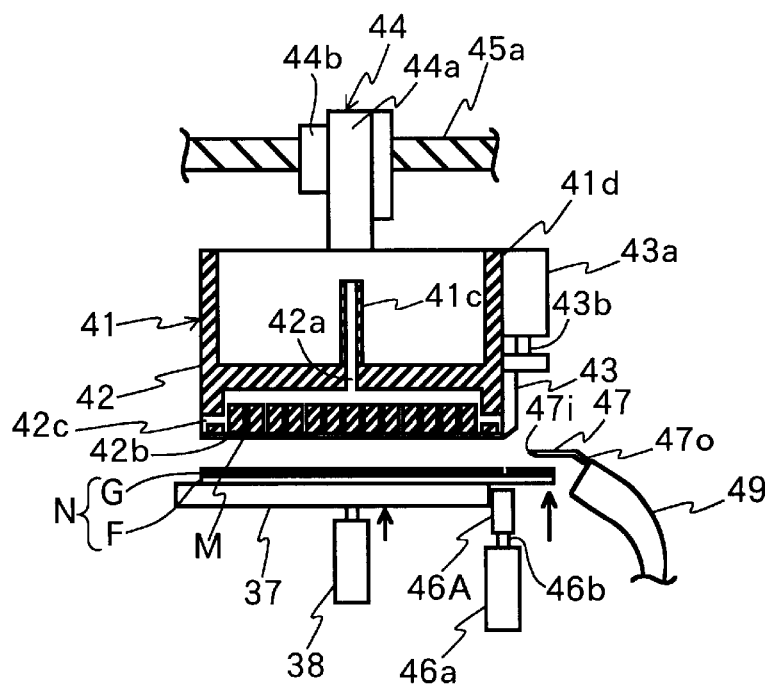
FIG. 13 is an operation descriptive view of the manufacturing apparatus shown in FIG. 12, illustrating the head as set at the cutting position.

The cutting-transfer section 40 comprises, more specifically as shown in FIG. 13, a head 41 having a box-shaped sucker 42 and a cutting blade 43 that can be lifted freely; a holding member 44 holding the head 41; a transfer mechanism 45, which transfers the holding member 44; a horizontal member 46A that can be lifted freely; a stripping-guiding plate 47, which strips off the conductive sheet G from the carrier film F, and guide the carrier film F onto the discharge side; and a discharge hopper 49, which drops the carrier film F from which the conductive sheet G has been stripped off into the dust box 2. And, the cutting mechanism is comprised the box-shaped sucker 42, the cutting blade 43, and the horizontal member 46A, while the stripping mechanism is comprised of the box-shaped sucker 42, the transfer mechanism 45, the horizontal member 46A, and the stripping-guiding plate 47. Note that the holding member 44 which holds the head 41, the transfer mechanism 45 which transfers the holding member 44, and the stripping-guiding plate 47 are the same as the components in embodiment 1.

The head 41 has a box shape having an open upper surface, and the exhaust pipe 41c is arranged at the center of the bottom of the head 41. The leading end (lower end) of the exhaust pipe 41c is connected to the exhaust hole 42a formed on the upper surface of the box-shaped sucker 42 after passing through the bottom of the head 41. Although not shown in a figure, flexible piping from an exhaust unit (not shown in a figure) is connected to the upper end of this exhaust pipe 41c.

The box-shaped sucker 42 is hollow, and the upper surface thereof is formed integrally with the bottom of the head 41. As described above, the leading end of the exhaust pipe 41c is connected to the exhaust hole 42a formed at the center of the upper surface thereof after passing through the bottom of the head 41. The mesh plate M is attached to the lower surface thereof, and although not clearly shown in the figure, many through-holes 42b for sucking the conductive sheets G are formed. On the other hand, although not clearly shown in the figure, the pressure adjusting holes 42c for adjusting the negative pressure in the box-shaped sucker 42 upon sucking the conductive sheet G to the sucking surface are provided at appropriate intervals on the side thereof.

The flat side surface of the cutting blade 43 is brought into contact with the front surface 41d of the head 41, and is attached so as to be slid up and down freely in a manner that the blade shall not be projected from the lower surface of the box-shaped sucker 42 at the initial position. More specifically, the air cylinder 43a is fixed to the upper part of the front surface 41d, and the leading end of the rod 43b thereof is connected to the back of the cutting blade 43, thereby the cutting blade 43 is attached to the front surface 41d so as to be moved up and down freely.

The horizontal member 46A is arranged at an appropriate position below the cutting blade 43, and the leading end of the rod 46b of air cylinder 46a lifting and lowering the horizontal member 46A is connected to the center of the lower surface thereof. Lifting and lowering movement of the horizontal member 46A by the air cylinder 46a is adjusted so as not to cause any trouble in the cutting of the unnecessary portion Ga of the conductive sheet G and in the stripping of the conductive sheet G from the carrier film F caused by the cutting blade 43.

The discharge hopper 49 has an appropriate shape, and is arranged so as to receive the carrier film F discharged from the stripping-guiding plate 47.

Next, lamination of the conductive sheets G in the manufacturing apparatus J1 having the configuration as described above will now be described with reference to FIGS. 13 to 16. Note that this lamination is carried out under control by the controller 70.

Figure 14:
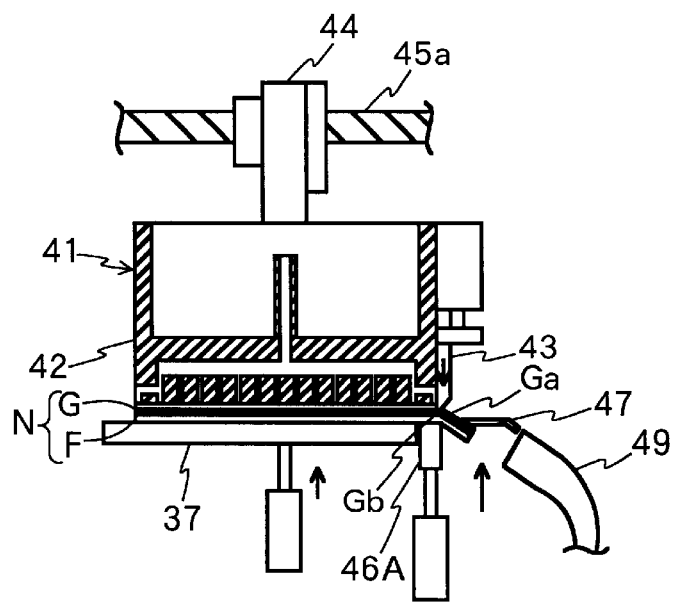
FIG. 14 is an operation descriptive view of the manufacturing apparatus shown in FIG. 12, illustrating the conductive sheet cut by the cutting blade.
Figure 15:
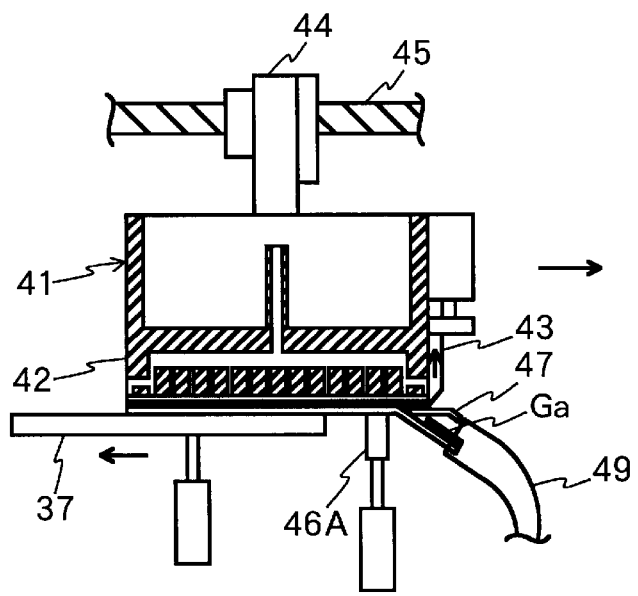
FIG. 15 is an operation descriptive view of the manufacturing apparatus shown in FIG. 12, illustrating the conductive sheet stripped off by the stripping-guiding plate.
Figure 16:
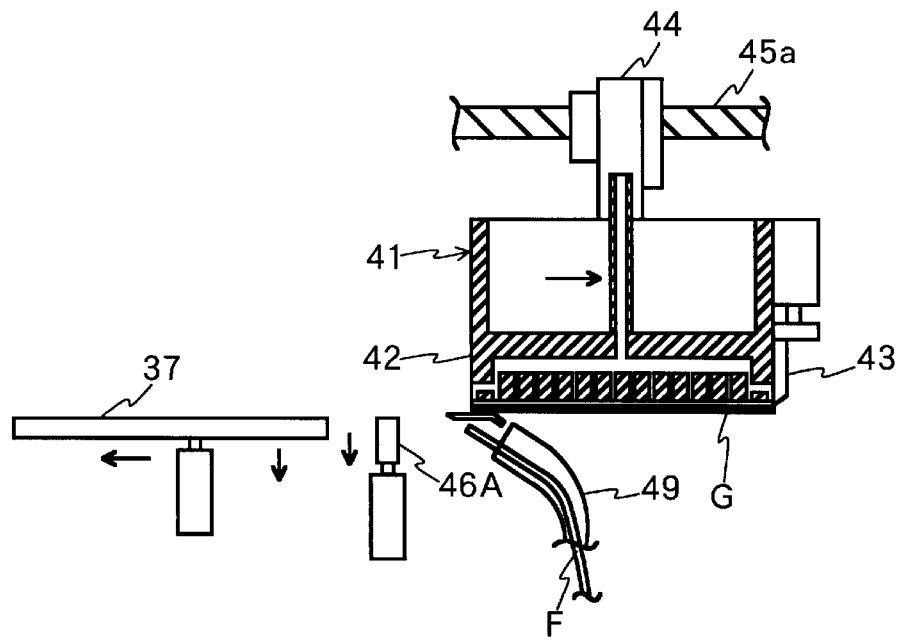
FIG. 16 is an operation descriptive view of the manufacturing apparatus shown in FIG. 12, illustrating the completion of stripping of the conductive sheet by the stripping-guiding plate.
Figure 17:
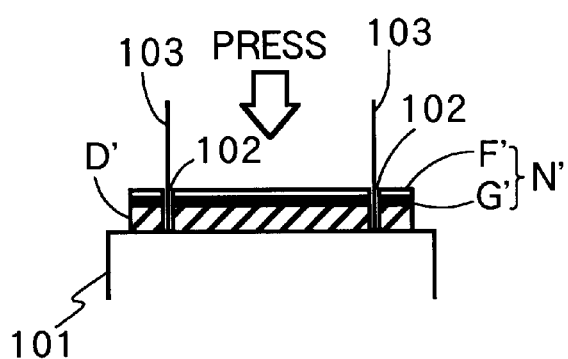
FIG. 17 is a descriptive view of the conventional manufacturing method of a thin-film laminate.
Figure 17:
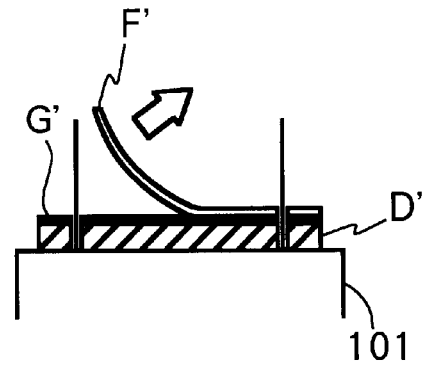
Figure 18:
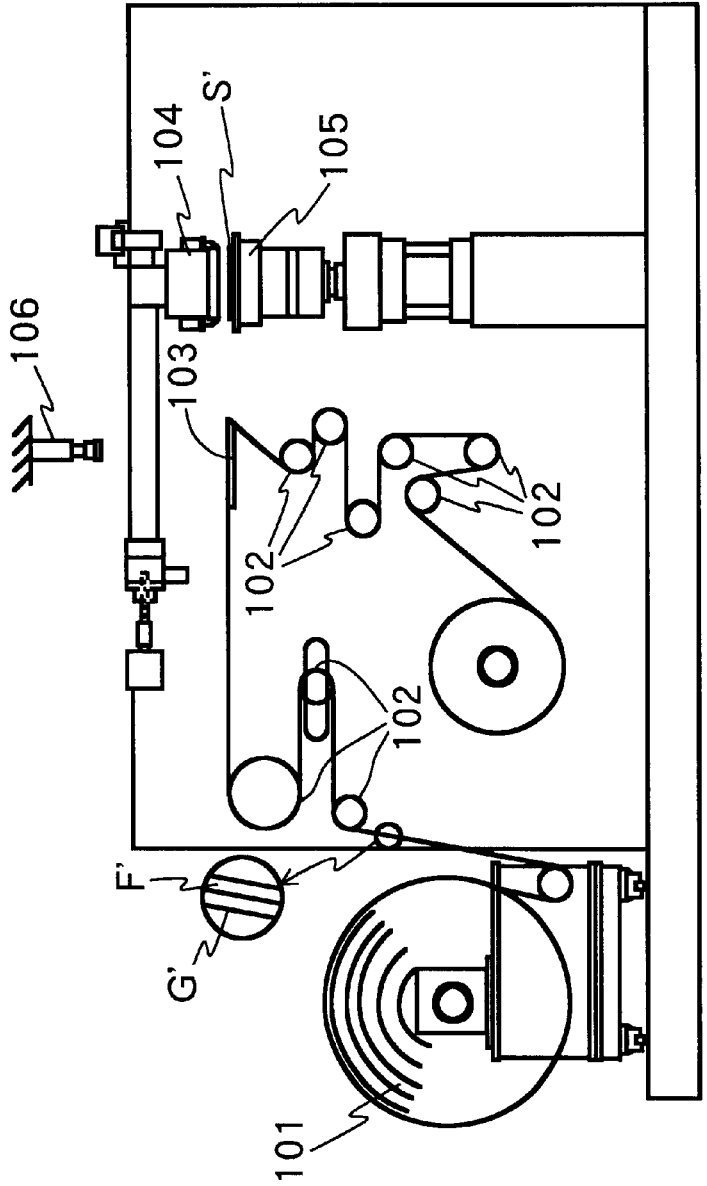
FIG. 18 is a schematic front view of the conventional manufacturing apparatus of a thin-film laminate.

(1) By rotating the turntable 12 for a prescribed amount of rotation, the housing case 11a housing the two-layer sheet pieces N having the prescribed conductive patterns printed thereon is set at the take-out position A;

(2) By lowering the sucker 22b after positioning the carry-out jig 22 at the take-out position A, the two-layer sheet pieces N housed in the housing case 11a is sucked and held;

(3) After restoring the sucker 22b sucking and holding the two-layer sheet pieces N back to the initial height, the carry-out jig 22 is moved to the delivery position B by the horizontal drive mechanism 21;

(4) After lowering the sucker 22b and placing the two-layer sheet pieces N on the moving table 37, suction by the sucker 22b is released;

(5) After sucking and holding the two-layer sheet piece N on the moving table 37, the moving table 37 is transferred to the cutting position C by driving the horizontal drive mechanism 36;

(6) By setting the CCD image pickup units 61 and 61 at the cutting position C by positioning the head 41 to the pressing-laminating position D, the CCD image pickup units 61 and 61 are caused to pick up an image of the positioning mark of the conductive sheet G;

(7) After causing the image processing section 62 to perform a prescribed image processing to the image picked up by the CCD image pickup units 61 and 61, the movement amount correcting section 63 is caused to calculate the amount of the movement upon moving the head 41 from the pressing-laminating position D to the cutting position C, as well as the amount of the movement upon moving the same head from the cutting position C to the pressing-laminating position D on the basis of the image-processed image data;

(8) By moving the holding member 44 in accordance with the amounts of the movement calculated as above by driving the transfer mechanism 45, the head 41 is positioned to the cutting position C (refer to FIG. 13);

(9) After raising the moving table 37, and by bringing the conductive sheet G into contact with the sucking surface of the box-shaped sucker 42, the suction and fixing of the two-layer sheet piece N by the moving table 37 is be released;

(10) By achieving a prescribed negative pressure in the box-shaped sucker 42, the conductive sheet G is sucked and held onto the sucking surface;

(11) Simultaneously with this, the horizontal member 46A is raised (refer to FIG. 14). This amount of raising is determined so that the gap between the two-layer sheet piece N sucked and held on the sucking surface of the box-shaped sucker 42 and the horizontal member 46A is within a range of 10 μm to 100 μm. This is for the sake of ensuring smooth stripping of the carrier film F by the cooperation of the horizontal member 46A and the stripping-guiding plate 47 when moving the head 41 toward the pressing-laminating position D;

(12) By lowering the cutting blade 43, the unnecessary portion Ga of the conductive sheet G shall be separated (refer to FIG. 14). In this case, the lowering pressure of the cutting blade 43 is adjusted so as not to cut the carrier film F when cutting the unnecessary portion Ga;

(13) By raising the cutting blade 43, it is returned to the initial position;

(14) By driving the transfer mechanism 45 again, the holding member 44 is moved by the amount of the movement calculated in (7) above. That is to say, it causes the head 41 to move horizontally toward the pressing-laminating position D;

(15) As shown in FIG. 14, the portion of the carrier film F, on which the leading end of the unnecessary portion Ga is placed, is in contact with the knife-edge-shaped surface on the carry-in side 47i of the stripping-guiding plate 47 via the unnecessary portion Ga, and therefore, the portion of the carrier film F, on which the unnecessary portion Ga is placed, creeps under the stripping-guiding plate 47, while keeping the unnecessary portion Ga placed on it, along with the horizontal transfer of the head 41. In this case, because the carrier film F has an appropriate elasticity, the unnecessary portion Ga creeps under the stripping-guiding plate 47, while a force is being applied onto the knife-edge-shaped surface by the restoring force of the carrier film F;

(16) Horizontal movement of the head 41 directed toward the pressing-laminating position D is continued, and the separating groove Gb reaches the leading end of the knife-edge-shaped surface. As described above, since the carrier film F tends to return to the original flat sheet under the effect of its restoring force, when the separating groove Gb reaches the leading end of the knife-edge-shaped surface, the carrier film F comes into contact with the leading end of the knife-edge-shaped surface directly;

(17) Horizontal movement of the head 41 directed toward the pressing-laminating position D is continued, and the carry-in side 47i of the stripping-guiding plate 47 penetrates into the boundary between the carrier film F and the conductive sheet G, while keeping the knife-edge-shaped surface thereof in contact with the carrier film F (refer to FIG. 15). This causes partial stripping of the conductive sheet G from the carrier film F. Simultaneously with this, the movement of the moving table 37 is started toward the initial position;

(18) Horizontal movement of the head 41 toward the pressing-laminating position D is continued, and the leading end of the carrier film F is guided by the discharge side 47o of the stripping-guiding plate 47 to enter the discharge hopper 49;

(19) Horizontal movement of the head 41 directed toward the pressing-laminating position D is continued, and the trailing end of the conductive sheet G is separated from the rear end of the carrier film F. That is to say, stripping of the conductive sheet G from the carrier film F is now completed. Along with this, the horizontal member 46A is returned to the initial position, and the moving table 37 is lowered to the initial height;

(20) The conductive sheet G stripped off from the carrier film F is sucked and held by the head 41, and is transferred to the pressing-laminating position D. On the other hand, the carrier film F, from which the conductive sheet G has been stripped off, is discharged from the discharge hopper 49 into the dust box 2;

(21) When the head 41 sucking and holding the conductive sheet G is positioned at the pressing-laminating position D, the conductive sheet G is placed on the press table 52 by driving the pressing-laminating mechanism 51;

(22) By repeating the steps (1) to (21) for a number of the prescribed times, lamination of the laminate S comprising a prescribed number of the conductive sheets G laminated thereon is completed. Note that in the step (21), the position of the press table 52 is adjusted by driving the table position correcting mechanism 53 according to necessity.

According to this embodiment 2, as described above, as in embodiment 1, the conductive sheets G are stripped off from the two-layer sheet pieces N cut previously into a prescribed size, and then pressed and laminated. Therefore, even in case of manufacturing the laminate S, in which various kinds of the conductive patterns to be printed on the conductive sheets to be laminated are present, it is not necessary to print the conductive patterns in the sequence of lamination, and therefore, the printing operation of the conductive patterns can be simplified considerably.

Moreover, in embodiment 2, the two-layer sheet N is transferred to the cutting position by the moving table 37 that can be moved by the ball screw driving method, and therefore, the positioning accuracy of the two-layer sheet piece N can be improved, and thereby the productivity can also be improved.

The present invention has been described as above by means of the embodiments. However, the invention is not limited only to these embodiments, but various modifications are also possible. In the embodiments, for example, each housing case contains the conductive sheet bearing a kind of prescribed conductive pattern, but the invention is not limited only to this. The conductive sheets containing different conductive patterns may be housed in the housing cases in the laminating sequence, and the conductive sheet may be continuously and sequentially taken out and transferred. Moreover, while the separating groove is formed by the cutting blade provided on the head in these embodiments, the cutting blade of the head may be omitted by housing the previously formed separating groove in each housing case.

According to the present invention, as described above in detail, even in case of manufacturing the thin-film laminate, in which various kinds of conductive patterns are to be printed on thin-film sheets to be pressed and laminated, an excellent advantage is available in that the printing operation of conductive patterns never becomes complicated.

Moreover, since the thin-film sheets are stripped off from the carrier film in the middle of transfer to the pressing-laminating position, this brings about an excellent effect of efficient pressing and laminating of the thin-film sheets.

I claim:

1. A manufacturing method of a thin-film laminate for manufacturing the thin-film laminate by sequentially laminating thin-film sheets having conductive patterns formed thereon, comprising the steps of housing the thin-film sheets held by carrier films adjusted to a prescribed size in a housing case; and in a middle of conveyance of the thin-film sheets in a state held by the carrier films and taken out from the housing case to a pressing and laminating position, stripping the thin-film sheets off the carrier films by causing a carrier to hold the thin-film sheet, and causing a stationary stripping member to penetrate into a boundary between the thin-film sheet and the carrier film while the thin-film sheet and the carrier film are being conveyed to strip the thin-film sheet off the carrier film.

2. A manufacturing method of a thin-film laminate according to claim 1, wherein the stripping member includes a carry-in side, the carry-in side of the stripping member is a knife-edge shape.

3. A manufacturing method of a thin-film laminate according to claim 1, wherein the carrier film from which the thin-film sheet has been stripped off is guided to a discharge side by the stripping member.

4. A manufacturing method of a thin-film laminate for manufacturing the thin-film laminate by sequentially laminating thin-film sheets having conducting patterns formed thereon, comprising the steps of housing the thin-film sheets held by carrier films adjusted to a prescribed size in a housing case; and in a middle of conveyance of the thin-film sheets in a state held by the carrier films and taken out from the housing case to a pressing and laminating position, stripping the thin-film sheets off the carrier film while conveying the same, wherein the length of the carrier film in the conveying direction is longer than the thin-film sheet; the increment in length is projected in the conveying direction; and the stripping member is caused to penetrate into the boundary between the thin-film sheet and the carrier film while moving the stripping member along the projecting portion.

5. A manufacturing method of a thin-film laminate according to claim 4, comprising the steps of forming an unnecessary portion integrally with the thin-film sheet on the portion projecting in the conveying direction of the carrier film; then, positioning the thin-film sheet at a prescribed position; forming a separating groove at the boundary with the unnecessary portion; and causing the stripping member to penetrate into the boundary between the thin-film sheet and the carrier film while moving the stripping member along the bottom of the separating groove.

6. A manufacturing method of a thin-film laminate according to claim 5, wherein the separating groove is formed during conveyance of the thin-film sheet to the laminating position.

7. A manufacturing method of a thin-film laminate according to claim 5, wherein the separating groove is formed prior to conveyance of the thin-film sheet.

8. A manufacturing apparatus of a thin-film laminate for manufacturing a thin-film laminate by sequentially laminating thin-film sheets having conductive patterns formed thereon, comprising: a housing means which houses carrier films adjusted to a prescribed size holding thin-film sheets; a carry-out means which takes out the thin-film sheets housed in the housing means in a state held by the carrier films and transfers the same to a prescribed position; a conveying means which conveys the thin-film sheets taken out by the carry-out means in a state held by the carrier films to a prescribed position; a stripping means which strips off the thin-film sheets conveyed to the prescribed position by the conveying means from the carrier films while conveying the same; and a pressing-laminating means which presses and laminates the thin-film sheets.

9. A manufacturing apparatus of a thin-film laminate according to claim 8, further comprising a positioning means.

10. A manufacturing apparatus of a thin-film laminate according to claim 9, further comprising a separating groove forming means.

11. A manufacturing apparatus of a thin-film laminate according to claim 8, wherein the stripping means comprises a carrier which carries the thin-film sheets, and a stripping-guiding plate; wherein the thin-film sheet is stripped off from the carrier film by causing a carry-in side of the stripping-guiding plate to penetrate into the boundary between the thin-film sheet and the carrier film; and the carrier film is guided by a discharge side of the stripping-guiding plate to the discharge side.

12. A manufacturing apparatus of a thin-film laminate according to claim 11, wherein the carry-in side of the stripping-guiding plate is formed into a knife-edge shape.

* * * * *